US006174425B1

(12) United States Patent
Simpson et al.

(10) Patent No.: US 6,174,425 B1
(45) Date of Patent: *Jan. 16, 2001

(54) PROCESS FOR DEPOSITING A LAYER OF MATERIAL OVER A SUBSTRATE

(75) Inventors: Cindy Reidsema Simpson; Matthew T. Herrick, both of Austin; Gregory S. Etherington, Cedar Creek; James Derek Legg, Austin, all of TX (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/856,459

(22) Filed: May 14, 1997

(51) Int. Cl.[7] .............................. C25D 17/06; C25D 21/00
(52) U.S. Cl. ................ 205/96; 204/297.01; 204/DIG. 7; 205/80; 205/123; 205/223
(58) Field of Search ................................ 205/96, 97, 123, 205/124, 143, 157, 223, 80; 204/DIG. 7, 285, 287, 297 R, 297 W

(56) References Cited

U.S. PATENT DOCUMENTS

| 2,751,340 | 6/1956 | Schaefer et al. ......................... 205/96 |
|---|---|---|
| 2,859,166 | 11/1958 | Grigger .................................. 204/279 |
| 3,880,725 | * 4/1975 | Van Raalte et al. .................... 205/95 |
| 4,148,707 | 4/1979 | Mayer et al. .................... 204/297.09 |
| 4,304,641 | 12/1981 | Grandia et al. ......................... 205/96 |
| 4,420,382 | 12/1983 | Reidl .................................... 205/724 |
| 4,421,627 | 12/1983 | LeBaron .......................... 204/297.13 |
| 4,466,864 | * 8/1984 | Bacon et al. .......................... 205/105 |
| 4,678,545 | 7/1987 | Galik ......................................... 25/50 |
| 4,720,329 | 1/1988 | Sirbola .................................. 205/143 |
| 4,879,007 | 11/1989 | Wong .................................... 205/137 |

(List continued on next page.)

FOREIGN PATENT DOCUMENTS

| 195 47 948 C1 | 12/1996 | (DE) . |
|---|---|---|
| 500 513 A1 | 8/1992 | (EP) . |
| 0 666 343 A1 | 8/1995 | (EP) . |
| 2 089 838 | 6/1982 | (GB) . |
| WO 87/07654 | 12/1987 | (WO) . |

OTHER PUBLICATIONS

Database WPI, Section Ch, Week 7946, Derwent Publications Ltd., London, GB; Class M11, AN 79–83249B, XP002110736 & JP 54 128945 A (Sumitomo Metal Ind Ltd), Oct. 5, 1979 (Oct. 5, 1979) Abstract.

F.A. Lowenheim, Electroplating, McGraw–Hill Book Co., New York, pp 152–155, 160–163, 363–377, 1978 no month available.*

R.H. Rousselot, "Current–Distribution Improving Aids", Metal Finishing, pp 57–63, Mar. 1961.*

* cited by examiner

Primary Examiner—Kathryn Gorgos
Assistant Examiner—William T. Leader
(74) Attorney, Agent, or Firm—George R. Meyer

(57) ABSTRACT

An electroplating system (30) and process makes electrical current density across a semiconductor device substrate (20) surface more uniform during plating to allow for a more uniform or tailored deposition of a conductive material. The electrical current density modifiers (364 and 37) reduce the electrical current density near the edge of the substrate (20). By reducing the current density near the edge of the substrate (20), the plating becomes more uniform or can be tailored so that slightly more material is plated near the center of the substrate (20). The system can also be modified so that the material that electrical current density modifier portions (364) on structures (36) can be removed without having to disassemble any portion of the head (35) or otherwise remove the structures (36) from the system. This in-situ cleaning reduces the amount of equipment downtime, increases equipment lifetime, and reduces particle counts.

49 Claims, 3 Drawing Sheets

U.S. PATENT DOCUMENTS

| | | | |
|---|---|---|---|
| 5,084,153 | 1/1992 | Mosse et al. | 204/230.3 |
| 5,135,636 * | 8/1992 | Yee et al. | 205/96 |
| 5,149,419 | 9/1992 | Sexton et al. | 205/75 |
| 5,230,743 | 7/1993 | Thompson et al. | 134/32 |
| 5,312,532 | 5/1994 | Andricacos et al. | 204/229.4 |
| 5,332,487 | 7/1994 | Young, Jr. et al. | 205/80 |
| 5,582,708 | 12/1996 | Delfrate et al. | 205/129 |
| 5,620,581 * | 4/1997 | Ang | 205/96 |

PROCESS FOR DEPOSITING A LAYER OF MATERIAL OVER A SUBSTRATE

FIELD OF THE INVENTION

This invention relates in general to processes and systems for depositing layers on substrates, and more particularly, processes and systems for electroplating metal-containing layers on those substrates

BACKGROUND OF THE INVENTION

Currently semiconductor devices are requiring higher current densities for operation while still resisting electromigration or other reliability problems Copper is being investigated as being a possible alternative to current aluminum or aluminum-copper metalization. One of the most promising methods of depositing copper on a substrate is by using plating methods, such as electroplating FIG. 1 includes an illustration of a cross-section view of a prior art electroplating system 10. The system 10 includes a chamber 11 with an outlet port 102. The system further includes a cup 12 that has an inlet port 112 for receiving a plating fluid and a diffuser 13 within cup 12. An anode 14 lies between the cup 12 and the diffuser 13 The system 10 further includes a head 15 that has a turntable 151 and clamp fingers 152. The clamp fingers 152 are the cathode for the system 10 and are typically made of platinized titanium. In the operation of the system 10, the plating solution 19 enters the cup 12 through the inlet port 112, flows by the anode 14, at which point ions from the anode 14 are dissolved into the plating solution 19. The plating solution 19 continues to flow up through the diffuser 13 to reach the substrate 20. The plating solution 19 eventually flows over the sides of the cup 12, down between the walls of the cup 12 and the chamber 11, and through the outlet port 102. The anode 14 and clamp fingers 152 are biased to plate the substrate 20.

During operation of this prior art system 10, nonuniform deposition typically occurs as illustrated in FIG. 2. As shown in FIG. 2, the semiconductor device substrate 20 has a base material 22 that can be an insulator, a conductor, or a combination of insulators and conductors with a conductive seed layer 24 overlying the base material 22. Plated material 26 is plated onto the seed layer 24. Note that the substrate 20 is loading into system 10 upside down. In FIG. 2, the substrate has been turned upright so that layer 26 faces the top of FIG. 2. As shown in FIG. 2, the deposition of the plated material 26 is typically thicker near the edge of the substrate 20 and thinner near its center point. This nonuniform deposition causes problems, particularly if the plated material 26 is to be chemically mechanically polished. Polishing typically removes material faster near the center and slower near the edges of the substrate. The combination of the thicker portion of the plated material 26 near the edge of the substrate 20 and the lower polishing rate near the edge accentuates the nonuniformity of the plated material 26 after polishing. During polishing, too much of the underlying base material 22 is removed due to non-ideal polishing selectivity or a ring of residual material is left around the edge of the substrate 20, where neither are desired.

Electrical robber plates are used in plating printed circuit board substrates. The robber plate is attached to the board and is destructively removed by cutting the piece of the board having the robber plate.

A need exists to create a system that is either more uniform in deposition or is capable of plating slightly more material near the center of the substrate compared to its edges to compensate for the accelerated polishing typically seen near the center of a substrate.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A new electroplating system and process makes the electrical current density across a semiconductor device substrate surface more uniform during plating to allow for a more uniform or tailored deposition of a conductive material. The electrical current density modifiers reduce the electrical current density near the edge of the substrate where the plating rate would otherwise be the highest. By reducing the current density near the edge of the substrate, the plating becomes more uniform or can be tailored so that slightly more material is plated near the center of the substrate. The system can also be modified so that the material that deposits on clamping structures can be removed without having to disassemble any portion of the head or otherwise remove the arc-shaped electrical current density modifier from the system. This in-situ cleaning reduces the amount of equipment downtime, increases equipment lifetime, and reduces particle counts.

Figure 1:
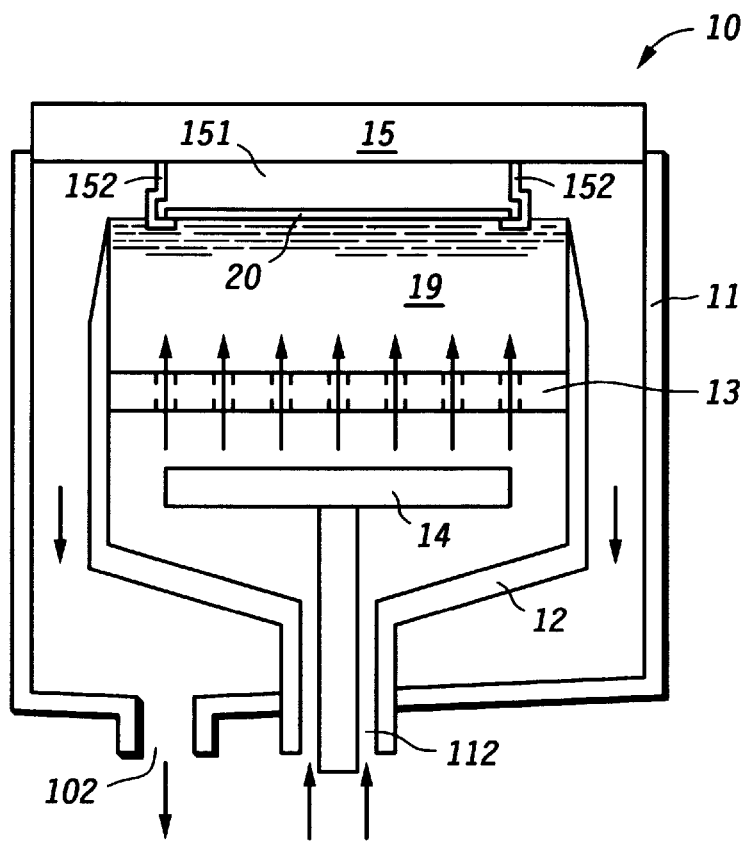
FIG. 1 includes an illustration of a cross-sectional view of a prior art plating system.
Figure 2:
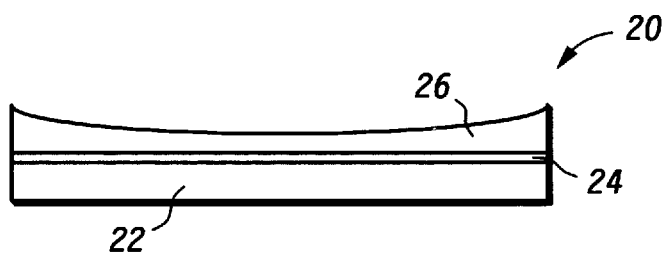
FIG. 2 includes an illustration of a cross-sectional view of a portion of a semiconductor substrate after a material has been plated onto the substrate using a prior art method.
Figure 3:
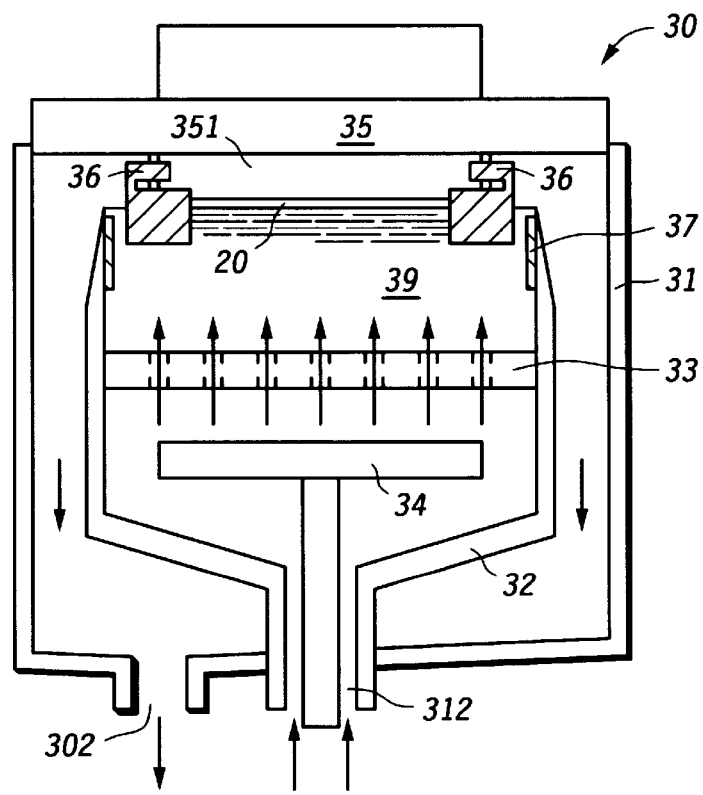
FIG. 3 includes an illustration of a cross-section view of an electroplating system in accordance with an embodiment of the present invention.
Figure 4:
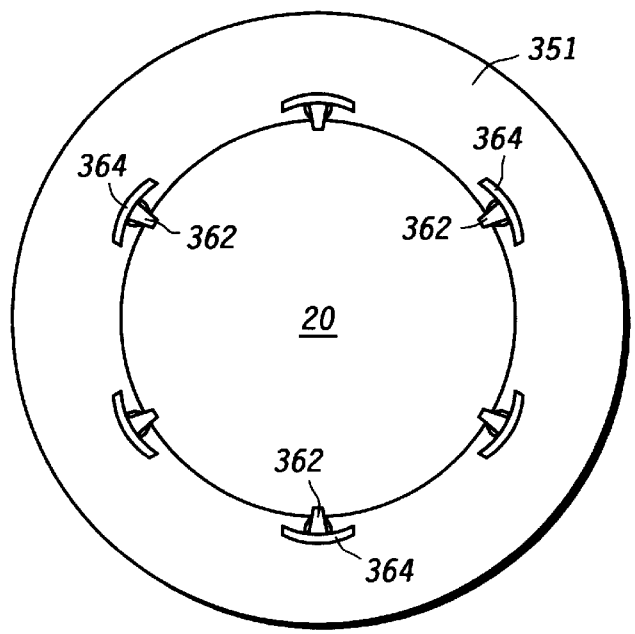
FIG. 4 includes an illustration of a top view of the plating head illustrating the relationship between the substrate and the clamp structures in according with an embodiment of the present invention.

FIGS. 3 and 4 includes illustrations of an electroplating system 30 in accordance with an embodiment of the present invention. The system 30 is similar to system 10, however, system 30 includes clamp structures 36 with clamp portions 362 (cathode or second electrode) and arc-shaped electrical current density modifier portions 364, and a ring-shaped electrical current density modifier 37. The system 30 includes a chamber 31 with an outlet port 302, and a cup 32 with an inlet port 312 for receiving a plating fluid. Within cup 32, a diffuser 33 creates more laminar flow of the plating solution (ionic liquid) 39 through the cup 32. An anode 34 (first electrode) lies between the cup 32 and the diffuser 33. The anode 34 typically includes the material that will be plated onto a semiconductor device substrate 20.

The system 30 further includes a head 35 that has a turntable 351 and clamp structures 36, and a ring-shaped modifier 37. The turntable 351, diffuser 33, cup 32, and chamber 31 include a non-conductive material, such as polyethylene, fluorocarbons (i.e., Teflon™), or the like. These materials reduce the likelihood of any current conduction or any adverse reactions with the plating solution. The anode 14, the clamp structures 36 and ring-shaped modifiers 37, any conductive layers that are on the substrate 20, such as the conductive seed layer 24, should be the only conductive materials in contact with the plating solution 39.

FIG. 4 includes an illustration of a top view of a semiconductor device substrate 20 being held onto the turntable 351 with clamp structures 36. Each of the structures 36 includes a clamp portion 362 and an electrical current density modifier portion 364. The clamp portion 362 and the electrical current density modifier portion 364 are conductive. The portion 364 is at least one mm wider and extends at least one mm further toward the anode 34 compared to the part of portion 362 that lies between the substrate 20 and the anode 34. In this particular embodiment, the arc length of each of the portions 364 is in a range of approximately 5–50 mm and is nominally 25 mm. The height of each of the arc-shaped modifier portions 364 is in a range of approximately 5–15 mm and is nominally 10 mm. The thickness of each of the portions 364 is in the range of approximately 2–6 mm thick. The ring-shaped modifier 37 is conductive and positioned so that there is a gap in a range of approximately 5–15 mm between the structure 36 and the ring-shaped modifier 37. Similar to portions 364, modifier 37 extends further toward the anode 34. Modifier 37 has a circumference that is larger than the sum of the widths of the portions 362. In other words, modifier 37 is "wider" than the portions 362.

The ring-shaped modifier 37 generally has a height in a range of approximately 5–25 mm and a thickness in a range of 10–15 microns. In one embodiment, the ring-shaped modifier 37 is positioned near the top of the cup 32. The ring-shaped modifier 37 is located anywhere along the cup 32 between the diffuser 39 and the top of the cup 32. Typically the ring-shaped modifier 37 is attached to the cup 12. The ring-shaped modifier 37 can be a continuous ring or could be segmented along the walls of the cup 32. In one particular embodiment, both the structures 36 and ring-shaped modifier 37 are made of the same material as what is being plated onto the substrate 20 to reduce the likelihood of contamination of the plating solution 39. If a copper material is being plated, the structures 36, ring-shaped modifier 37 and anode 34 are made of copper. However, in alternative embodiments, different materials could be used. The cathode (second electrode) for the system 30 includes the clamp portions 362. The portions 364 and the ring-shaped modifier 37 are types of electrical current density modifiers for the system 30 and are spaced apart from the substrate 20.

A specific example of plating copper is discussed below. Although many details are given, the information is meant to illustrate and not limit the scope of the invention. In the operation of the system 30, the plating solution 39 enters the cup 32 through the inlet port 312. The plating solution includes copper (Cu), copper sulfate ($Cu_2SO_4$), sulfuric acid ($H_2SO_4$), and chloride ions, such as those from HCl. The plating solution 39 flows past the anode 34, at which point ions from the anode 34 are dissolved into the plating solution 39. The plating solution 39 continues to flow up through the diffuser 33 to reach the substrate 20. The plating solution 39 eventually flows over the sides of the cup 32, down between the walls of the cup 32 and the chamber 31, and through the outlet port 302.

During the first portion of the process, the anode 34 is conditioned by forming a copper oxide type film on at least a portion of the anode 34, particularly but not limited to the portion of the anode 34 directly facing the structures 36. After conditioning, additives are added to the solution 39 before a semiconductor substrate contacts the plating solution 39.

A conductive seed layer is formed over the primary surface (device side) of substrate 20. In this example, the substrate 20 is a circular wafer. The conductive seed layer 24 promotes plating onto the substrate 20. The conductive seed layer 24 typically includes a refractory metal containing material, such as titanium, tantalum, titanium nitride, tantalum nitride, and the like. The substrate 20 with the conductive seed layer 24 is then mounted onto the turntable 351 and is held in place by the clamp portions 362 of the structures 36. The head 35 is then lowered such that a portion of the structures 36 and the seed layer 24 is in contact with the plating solution 39. Caution should be exercised to keep the backside (unexposed) surface of the substrate 20 from contacting the solution 39.

Figure 5:
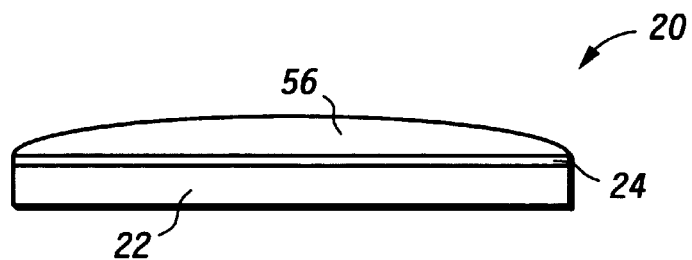
FIG. 5 includes an illustration of a cross-sectional view of a portion of a semiconductor device substrate after plating a material using an embodiment of the present invention.

During plating, the anode 34, structures 36, and ring-shaped modifier 37 are biased to deposit a layer 56 of plating material as shown in FIG. 5. Although the anode 34, structures 36, and ring-shaped modifier 37 can have positive or negative biasing polarities or be electrically grounded, the anode 44 is at a more positive potential compared to the structures 36 and ring-shaped modifier 37. In one particular embodiment, both the ring-shaped modifier 37 and the structures 36 are at approximately the same potential. In another embodiment, the ring-shaped modifier 37 is biased such that the potential on the structures 36 is between the potential of the anode 34 and the ring-shaped modifier 37. The biasing conditions can be held substantially constant during plating or varied over time (i.e., pulsed (square wave), sawtooth, sinusoidal, or the like). As used in this specification, biasing does not include electrically floating that component but can include placing one of the system components at ground potential.

For either embodiment, biasing the structures 36 and the ring-shaped modifier 37 help reduce the current density at the edge which in turn reduces the plating rate near the edge of the substrate 20 compared to if no electrical current density modifiers are used. The plating occurs until a desired thickness of the plated material 26 is formed. In one embodiment, this is typically in a range of approximately 6,000–15,000 angstroms. Unlike the prior art, the thickness of the plated material is more uniform or can be slightly thicker in the middle of the substrate 20 as illustrated in FIG. 5. Note that in FIG. 5, the substrate 20 has been turned over so that the plated material 26 faces the top of FIG. 5. The potential on the electrical current density modifiers are adjusted to achieve the desired uniformity results. Layer 56 can be deposited such that the difference in thickness of the layer 56 over the centerpoint and a point within ten millimeters from the edge of the substrate is no more five percent of the thickness of layer 56 over the centerpoint. During plating, the operational parameters except those as expressly stated are those that are conventionally used in the art.

The electric current density modifiers are not destructively removed from the substrate 20 as is done with the prior art thieves that are in contact with the printed circuit boards during plating. Subsequent processing must still be performed while the substrate 20 is in wafer form. If the electric current modifiers were in contact with the substrate 20 and were destructively removed, subsequent processing steps would be nearly impossible to perform because the substrate 20 would not have an essentially circular shape. The broken substrate would generate particles, have sharp edges, and would likely fracture further during subsequent processing steps which lowers yield.

After plating, processing is performed to form a substantially completed device. Steps can include chemical-mechanical polishing the layer 56, forming additional insulating and interconnect layers, if needed, and forming a passivation layer over the uppermost interconnect layer. If the layer 56 is used for solder bumps, layer 56 has a thickness over the centerpoint of the substrate that is in a range of approximately 40–160 microns and is patterned by etching.

After the plating is completed, a different substrate can be plated or the structures 36 can be cleaned by removing at least a portion of the plating material that is deposited on structures 36 when the plated layer 56 is deposited on the substrate 20. Cleaning can be accomplished different ways. In one embodiment, the cleaning can occur by biasing the structures 36 at a more positive potential compared to the anode 34. In still another embodiment, the structures 36 are biased at a more positive potential compared to the ring-shaped modifier 37. In this particular embodiment, the anode 34 electrically floats. If the anode 34 electrically floats, the film that is created on the anode 34 during conditioning will remain essentially undisturbed during the cleaning process. If the anode 34 is not allowed to float, the film should be affected and will need to be conditioned. After the cleaning step, additional substrates can be processed.

The system 30 can also be used to plate other materials including gold and nickel. Additionally, the system can be used to deposit alloys. For example conductive bumps used in semiconductor devices for ball grid arrays. The conductive bumps typically include a lead-tin alloy. Lead has an oxidation potential of +0.126 volts, and tin has an oxidation potential of +0.136. Therefore, tin is more readily oxidized compared to lead. The anode 34 should comprise the metallic element that is more readily oxidized and not the other metallic element. Otherwise, the anode 34 may become pitted after plating substrates. In this particular instance, the anode 34 should include tin but not lead. The plating solution 39 will include lead and tin in both elemental (reduced) and ionic (oxidized) states. The deposition parameters, particularly concentrations of lead and tin in the plating solution and biasing conditions for the anode 34, structures 36, and ring-shaped modifier 37, can be changed to modify the composition of the alloy. The alloy can have a substantially uniform or graded (discretely or continuously) composition.

In still another embodiment, the system 30 is used to deposit other electroactive materials onto the substrate 20. In this application, the material would be negatively charged, and therefore, the substrate 20 and structures 36 now becomes the anode and what used to be the anode 34 becomes the cathode. In this manner the current direction within the plating solution 39 is essentially reversed.

The present invention includes other embodiments. In one particular embodiment, the structures 36 are modified such that the clamp portions 362 and the portions 364 are separate pieces. In this case, the portions 364 and the clamp portions 362 are attached to the turntable as individual components. In other embodiments, the portions 364 are permanently attached to the clamp portions 362 or be a removable portion that could be taken off the clamp portions, from time to time.

During plating, the structures 36 can be completely or partially submerged within the plating solution 39. The shapes of one or both of the electrical current density modifiers should match the shape of the edge of the substrate 20. For example, the portions 364 are arc-shaped portions, and all points along the inner edge of those arc-shaped portions 364 are substantially equal distances from the substrate 20. If the substrate 20 is rectangular with straight edges, the arc-shaped modifier portions would have inner edges facing the substrate 20 and are substantially parallel to the corresponding edge of the substrate 20.

Alternative designs for the ring-shaped modifier 37 are also possible. In other embodiments, the ring-shaped modifier 37 extends above the top of the cup 32. For example, the ring-shaped modifier 37 could include castellated edges that allow the plating solution 39 to flow between the castellated edges and out of the cup 32. In this manner, the plating solution 39 is not in contact with the upper portion of the ring-shaped modifier 37. This would be most likely to be used if a segmented ring-shaped modifier would be used for plating. Similar to a previous embodiment, the shape of the ring-shaped modifier 37 generally should be about the same as the cup 32, which generally matches the shape of the substrate 20. In the case of a circular substrate 20, the ring-shaped modifier 37 and the cup 32 have circular shapes. If the substrate 20 is rectangular, the ring-shaped modifier 37 and the cup 32 also have rectangular shapes.

In still other embodiments, only portions of ring-shaped modifier 37 are conductive. In one particular embodiment, one segment of the ring-shaped modifier 37 has its upper half conductive and an adjacent portion of the ring-shaped modifier 37 would have its lower half conductive. In still another embodiment, all the upper portion or all the lower portion or any combination thereof is conductive. In any event, the positioning of the ring-shaped modifier 37 should be made such that the uniformity of plating is optimized.

The system 30 can be operated with only the structures 36 or the ring-shaped modifier 37 as the electrical current density modifiers. The use of both electrical current density modifiers increases the ability to better control the electrical current density during plating, and therefore, allow more control over the variation in thickness of the plated material 56 over the substrate 20

Figure 6:
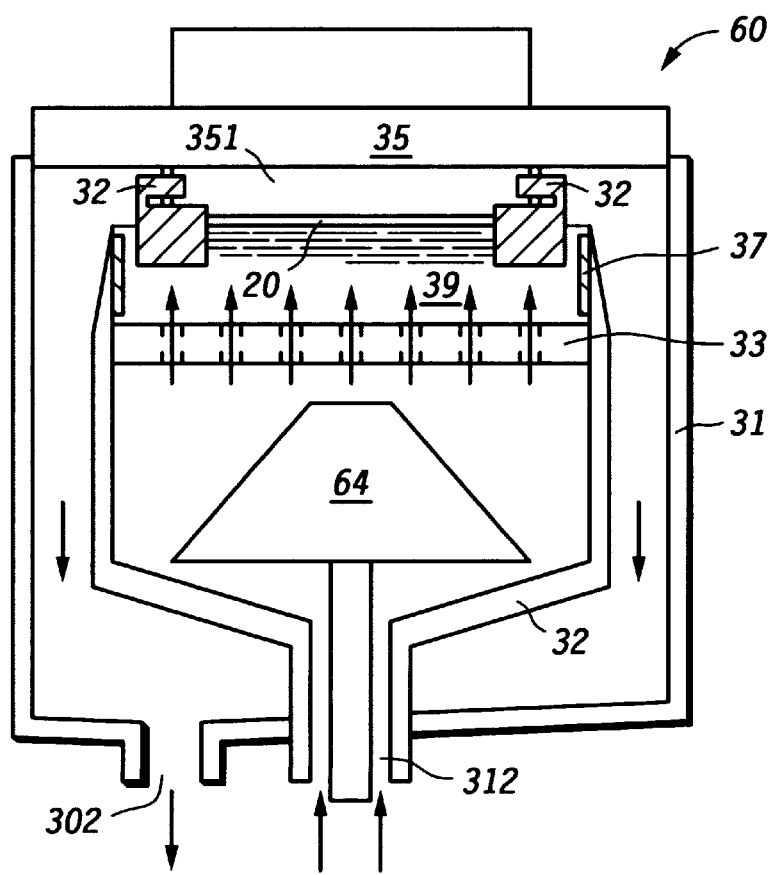
FIG. 6 includes an illustration of a cross-sectional view of a plating system with an anode design in accordance with another embodiment of the present invention.

In yet another embodiment, the anode shape can be modified to optimize the current density so that it is more uniform across the surface of the wafer. As illustrated in FIG. 6, a conical-shaped anode 64 has a tapered edge. This changes the current density near the substrate 20. Clearly, other shapes are possible.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

What is claimed is:

1. A process for depositing a layer of material over a substrate comprising:
   placing the substrate into a plating system including:
   a first electrode;
   a second electrode electrically connected to the substrate, wherein:
   the second electrode includes clamp portions and electrical current density modifier portions;

each of the electrical current density modifier portions lies closer to the first electrode compared to its corresponding clamp portion; and an ionic liquid, wherein the ionic liquid contacts the first electrode, the second electrode, and the substrate;

biasing the first electrode to a first potential and the second electrode to a second potential to deposit the layer of material on the substrate, wherein the first potential is different from the second potential; and removing the substrate from the plating system.

2. The process of claim 1, wherein the substrate has a circular shape and each of the electrical current density modifier portions has an arc shape.

3. The process of claim 1, wherein biasing comprises generating a pulsed potential difference that varies periodically over time.

4. The process of claim 1, wherein biasing deposits the layer of material selected from a group consisting of copper, gold, and nickel.

5. The process of claim 1, wherein the electrical current density modifier portions are not part of the clamp portions.

6. The process of claim 1, wherein the first electrode has a cross-section which is conical in shape.

7. The process of claim 1, wherein during biasing, the layer is deposited over a first point closer to a center of the substrate to a first thickness and over a second point closer to an edge of the substrate to a second thickness that is no more than the first thickness.

8. The process of claim 1, wherein, cumulatively, the electrical current density modifier portions surround part, but not all, of the substrate.

9. The process of claim 8, wherein removing the portion of the layer of material comprises electrically floating the first electrode.

10. The process of claim 1, wherein:

each of the electrical current density modifier portions has a first dimension extending in a first direction;

the first direction is towards the first electrode; and the first dimension is in a range of approximately 5–15 mm.

11. The process of claim 10, wherein:

each of the electrical current density modifier portions has a second dimension extending in a second direction;

the second direction is perpendicular to the first direction; and the second dimension is in a range of approximately 5–50 mm.

12. The process of claim 1, wherein:

the plating system further includes a conductor spaced apart from each of the first electrode, the second electrode, and the substrate; and further comprising biasing the conductor to a third potential and the second electrode to a fourth potential after removing the substrate from the plating system.

13. The process of claim 12, wherein the first electrode electrically floats and the third potential is lower than the fourth potential.

14. The process of claim 1, wherein:

the plating system further includes a conductor spaced apart from each of the first electrode, the second electrode, and the substrate; and transferring at least a portion of the layer of material from the second electrode to the conductor after removing the substrate from the plating system.

15. A process for depositing a layer of material over a substrate comprising:

placing the substrate into a plating system including:
 a cup;
 a first electrode within the cup;
 a second electrode electrically connected to the substrate;
 a conductor that is spaced apart from each of the substrate, the first electrode, and the second electrode; and
 an ionic liquid, wherein the ionic liquid contacts the first electrode, the second electrode, the substrate, and the conductor;

biasing the first electrode to a first potential and the second electrode to a second potential, wherein:
 the layer of material is deposited on the substrate and second electrode; and
 the first potential is different from the second potential;

removing the substrate from the plating system; and biasing the conductor to a third potential and the second electrode to a fourth potential after removing the substrate from the plating system, wherein the third potential is lower than the fourth potential, and wherein at least a portion of the layer of material on the second electrode is transferred to the conductor.

16. The process of claim 15, wherein during biasing the conductor, the first electrode electrically floats.

17. The process of claim 15, further comprising rotating the substrate with respect to the first electrode during the step of biasing the first electrode.

18. The process of claim 15, wherein biasing the first electrode to the first potential deposits the layer of material that is an alloy including a first metallic element and a second metallic element that is different from the first metallic element.

19. The process of claim 18, wherein:

the first electrode comprises the first metallic element and not the second metallic element;

the first metallic element has a higher oxidation potential compared to the second metallic element; and the ionic liquid includes ions of the second metallic element.

20. The process of claim 15, wherein the substrate is a semiconductor device substrate.

21. The process of claim 15, wherein the conductor has a ring shape and is attached to the cup.

22. The process of claim 21, wherein the conductor is segmented.

23. The process of claim 15, further comprising a step of rotating the conductor with respect to the first electrode during the step of biasing.

24. The process of claim 15, wherein during biasing the first electrode, the layer is deposited over a first point closer to a center of the substrate to a first thickness and over a second point closer to an edge of the substrate to a second thickness that is no more than the first thickness.

25. The process of claim 24, wherein the first thickness is greater than the second thickness.

26. The process of claim 15, wherein the substrate has circular shape and the conductor has a ring shape.

27. The process of claim 15, wherein:

the second electrode is part of a head;

the conductor is spaced apart from the head;

placing the substrate into the plating system further includes:

mounting the substrate onto the head; and
contacting the head with the ionic liquid.

28. The process of claim 15, wherein:
the conductor is completely submerged within the ionic liquid;
the conductor has a thickness and a length;
the thickness is measured in a direction substantially parallel to a primary surface of the substrate;
the length is measured in a direction substantially perpendicular to the primary surface of the substrate; and
the length is greater than the thickness.

29. A process for depositing a layer of material over a substrate comprising:
placing the substrate into a plating system including:
a cup;
a first electrode within the cup;
a second electrode electrically connected to the substrate;
a conductor that is spaced apart from each of the substrate, the first electrode, and the second electrode; and
an ionic liquid, wherein the ionic liquid contacts the first electrode, the second electrode, the substrate, and the conductor;
biasing the first electrode to a first potential and the second electrode to a second potential, wherein:
the layer of material is deposited on the substrate and second electrode; and
the first potential is different from the second potential;
removing the substrate from the plating system; and
transferring at least a portion of the layer of material from the second electrode to the conductor.

30. The process of claim 29, wherein transferring comprises electrically floating the first electrode and biasing the conductor to a third potential and the second electrode to a fourth potential.

31. The process of claim 30, wherein the third potential is lower than the fourth potential.

32. The process of claim 29, wherein:
the second electrode is part of a head;
the conductor is spaced apart from the head;
placing the substrate into the plating system further includes:
mounting the substrate onto the head; and
contacting the head with the ionic liquid.

33. The process of claim 29, wherein:
the conductor is completely submerged within the ionic liquid;
the conductor has a thickness and a length;
the thickness is measured in a direction substantially parallel to a primary surface of the substrate;
the length is measured in a direction substantially perpendicular to the primary surface of the substrate; and
the length is greater than the thickness.

34. A process for depositing a layer of material over a substrate comprising:
placing the substrate into a plating system including:
a first electrode;
a second electrode electrically connected to the substrate;
a conductor that is spaced apart from each of the substrate, the first electrode, and the second electrode; and
an ionic liquid, wherein the ionic liquid contacts the first electrode, the second electrode, the substrate, and the conductor;
biasing the first electrode to a first potential and the second electrode to a second potential, wherein:
the layer of material is deposited on the substrate and second electrode; and
the first potential is different from the second potential;
removing the substrate from the plating system; and
transferring at least a portion of the layer of material from the second electrode to the conductor.

35. The process of claim 34, wherein during the transferring, the first electrode electrically floats.

36. The process of claim 34, wherein during the transferring, the conductor is biased to a third potential and the second electrode is biased to a fourth potential.

37. The process of claim 36, wherein during the transferring, the third potential is lower than the fourth potential.

38. The process of claim 34, further comprising rotating the substrate with respect to the first electrode during the step of biasing the first electrode.

39. The process of claim 34, wherein biasing the first electrode to the first potential deposits the layer of material that is an alloy including a first metallic element and a second metallic element that is different from the first metallic element.

40. The process of claim 39, wherein:
the first electrode comprises the first metallic element and not the second metallic element;
the first metallic element has a higher oxidation potential compared to the second metallic element; and
the ionic liquid includes ions of the second metallic element.

41. The process of claim 34, wherein the substrate is a semiconductor device substrate.

42. The process of claim 34, wherein:
The plating system further comprises a cup; and
the conductor has a ring shape and is attached to the cup.

43. The process of claim 42, wherein the conductor is segmented.

44. The process of claim 34, further comprising a step of rotating the conductor with respect to the first electrode during the step of biasing.

45. The process of claim 34, wherein during biasing the first electrode, the layer is deposited over a first point closer to a center of the substrate to a first thickness and over a second point closer to an edge of the substrate to a second thickness that is no more than the first thickness.

46. The process of claim 45, wherein the first thickness is greater than the second thickness.

47. The process of claim 34, wherein the substrate has circular shape and the conductor has a ring shape.

48. The process of claim 34, wherein:
the second electrode is part of a head;
the conductor is spaced apart from the head;
placing the substrate into the plating system further includes:
mounting the substrate onto the head; and
contacting the head with the ionic liquid.

49. The process of claim 34, wherein:
the conductor is completely submerged within the ionic liquid;
the conductor has a thickness and a length;
the thickness is measured in a direction substantially parallel to a primary surface of the substrate;
the length is measured in a direction substantially perpendicular to the primary surface of the substrate; and
the length is greater than the thickness.

* * * * *